United States Patent

Suzuki

[11] Patent Number: 5,903,068
[45] Date of Patent: May 11, 1999

[54] ELECTROACOUSTIC TRANSDUCER

[75] Inventor: Kazushi Suzuki, Shizuoka, Japan

[73] Assignee: Star Micronics Co., Ltd., Shizuoka, Japan

[21] Appl. No.: 08/788,184

[22] Filed: Jan. 24, 1997

[30] Foreign Application Priority Data

Jan. 25, 1996 [JP] Japan ................................ 8-032776

[51] Int. Cl.$^6$ .................................................. H04R 1/02
[52] U.S. Cl. ........................... 310/12; 29/594; 340/391.1; 381/385; 381/395
[58] Field of Search ..................................... 310/341, 346, 310/363, 312; 29/594; 340/391.1; 381/385, 395, 150

[56] References Cited

U.S. PATENT DOCUMENTS

| | | |
|---|---|---|
| 4,687,633 | 8/1987 | Miyafuji et al. ........................ 420/481 |
| 4,926,022 | 5/1990 | Freedman ............................ 219/121.63 |
| 5,002,619 | 3/1991 | Tsuda et al. ........................ 148/11.5 R |
| 5,287,084 | 2/1994 | Sone ....................................... 340/388.4 |
| 5,371,943 | 12/1994 | Shibata ....................................... 29/827 |
| 5,451,813 | 9/1995 | Kazutaka ................................. 257/676 |
| 5,521,430 | 5/1996 | Shibata ..................................... 257/676 |
| 5,572,059 | 11/1996 | Walker et al. ........................... 257/448 |
| 5,605,582 | 2/1997 | Inoue et al. .............................. 148/320 |
| 5,625,700 | 4/1997 | Sone ......................................... 381/192 |
| 5,672,550 | 9/1997 | Tsuji et al. ............................... 437/219 |
| 5,691,241 | 11/1997 | Kazutaka ................................. 437/206 |

*Primary Examiner*—Thomas M. Dougherty
*Attorney, Agent, or Firm*—Sughrue, Mion, Zinn, Macpeak & Seas, PLLC

[57] ABSTRACT

An electroacoustic transducer has lead terminals formed of an alloy consisting of 32 to 55% by weight of Ni and a remainder essentially of Fe, and having a crystal grain size of 7.0 or greater. In an electroacoustic transducer, both coil terminals of the coil are connected to the associated lands of the lead terminals, and thermal conduction suppressing sections are provided at proximal end sides of lands of the lead terminals for suppressing thermal conduction.

3 Claims, 23 Drawing Sheets

FIG. 12

| SAMPLES | | MATERIAL PROPERTY VALUES | | | | | EVALUATION RESULTS | | | |
|---|---|---|---|---|---|---|---|---|---|---|
| | | TENSILE STRENGTH N/mm² | 0.2% YIELD STRENGTH N/mm² | VICKERS HARDNESS Hv | CRYSTAL GRAIN SIZE G.S.No | THERMAL CONDUCTIVITY cal/cm/sec/°C | DEFORMATION IN PRESS | DAMAGES ON RESIN WHEN SOLDERING COIL TERMINALS | SOLDER WETTING PROPERTY | GENERAL EVALUATION |
| Fe-36Ni ALLOY | EXAMPLE 1 | 570 620 660 | 520 560 600 | 155 195 217 | 7.5 9.0 10.5 | 0.025 | NONE NONE NONE | NONE NONE NONE | GOOD GOOD GOOD | GOOD GOOD GOOD |
| | COMPARATIVE EXAMPLE 1 | 490 | 290 | 140 | 6.0 | | OCCURRED | NONE | GOOD | NO GOOD |
| Fe-42Ni ALLOY | EXAMPLE 2 | 560 640 | 510 580 | 164 206 | 7.5 8.5 | 0.026 | NONE NONE | NONE NONE | GOOD GOOD | GOOD GOOD |
| | COMPARATIVE EXAMPLE 2 | 500 | 300 | 144 | 6.0 | | OCCURRED | NONE | GOOD | NO GOOD |
| Fe-50Ni ALLOY | EXAMPLE 3 | 600 700 | 540 630 | 199 245 | 8.0 11.5 | 0.032 | NONE NONE | NONE NONE | GOOD GOOD | GOOD GOOD |
| | COMPARATIVE EXAMPLE 3 | 520 | 310 | 160 | 6.5 | | OCCURRED | NONE | GOOD | NO GOOD |
| Fe-29Ni-17Co ALLOY | EXAMPLE 4 | 610 710 | 550 650 | 201 230 | 7.5 11.0 | 0.048 | NONE NONE | NONE NONE | GOOD GOOD | GOOD GOOD |
| | COMPARATIVE EXAMPLE 4 | 530 | 320 | 140 | 6.5 | | OCCURRED | NONE | GOOD | NO GOOD |
| BRASS (C2600) | COMPARATIVE EXAMPLE 5 | 380 440 | 320 380 | 84 120 | 8.5 10.5 | 0.29 | NONE NONE | OCCURRED OCCURRED | NO GOOD NO GOOD | NO GOOD NO GOOD |
| PHOSPHOR BRONZE (C5210) | COMPARATIVE EXAMPLE 6 | 590 580 | 490 460 | 182 175 | 12.0 9.0 | 0.15 | NONE NONE | OCCURRED OCCURRED | GOOD GOOD | NO GOOD NO GOOD |

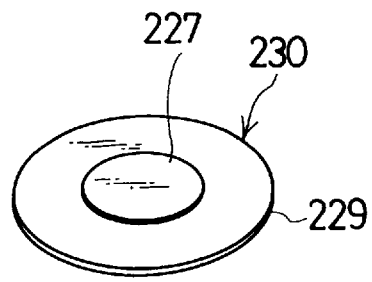
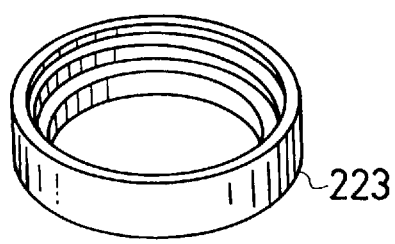
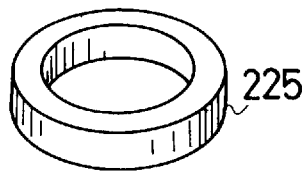
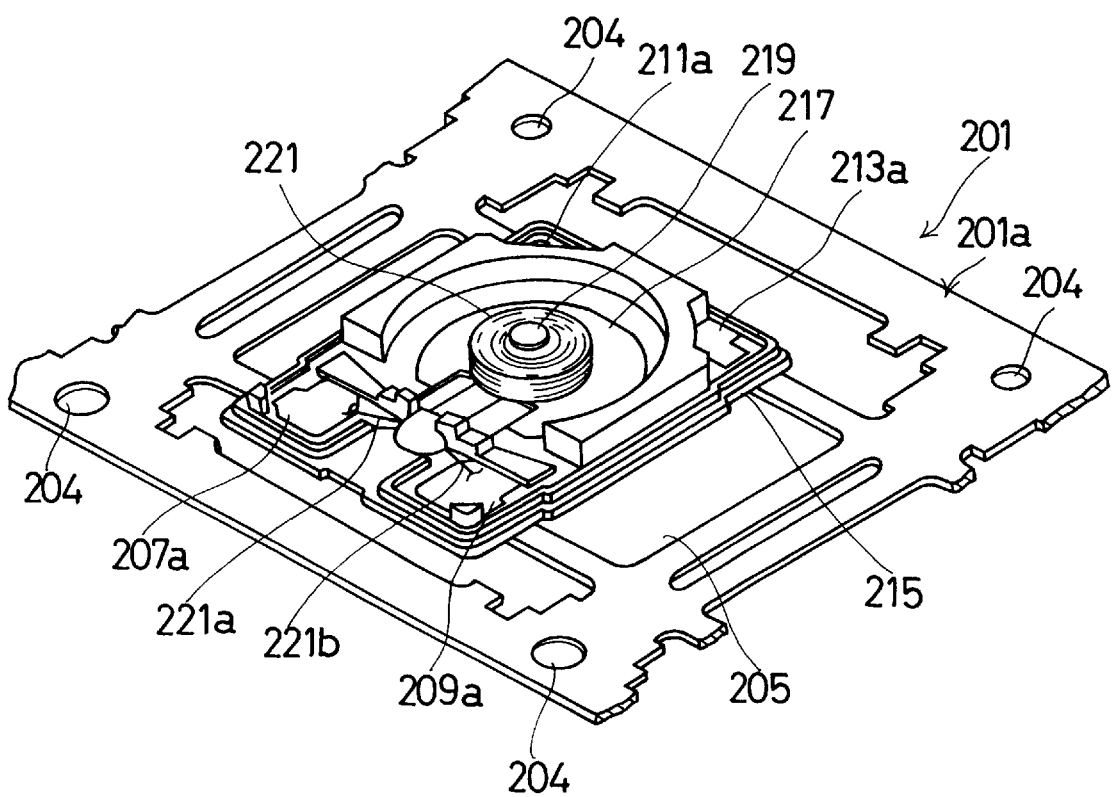
FIG.29 (PRIOR ART)

ELECTROACOUSTIC TRANSDUCER

BACKGROUND OF THE INVENTION

1. Field of the Invention

The present invention relates to an electroacoustic transducer for converting electric signals to acoustic signals, and, more particularly, to an electroacoustic transducer, using an improved material and structure for lead terminals, which suppresses the precipitation of the component that hinders the solder wetting property (good solder wetting property means that solder is well adhered to the lead terminals), which ensures a thinner lead frame, which accelerates the local heating of lands at the time of soldering coil terminals to the associated lands to thereby make it unnecessary to increase the heating temperature or heating time, thus preventing resin parts in the vicinity of the lands from being thermally damaged, and which prevents the soldered portion from being remelted by heat at the time the electroacoustic transducer is mounted on the mount board of an arbitrary electronic device.

2. Description of the Related Art

Referring to FIGS. 26 through 33, the structure of a conventional electroacoustic transducer will be explained according to the fabrication steps. To begin with, the structure of a lead frame 201 shown in FIG. 26 will be described. The lead frame 201 has a plurality of lead frame elements 201a (each lead frame element is encircled by an imaginary line in FIG. 27) coupled side by side to ensure the fabrication of a plurality of electroacoustic transducers, and FIG. 26 shows one of the lead frame elements 201a. Each lead frame element 201a has a pair of frame guide rails 203 and four guide holes 204. Formed between the pair of frame guide rails 203 is space 205 in which projecting pieces 207, 209, 211 and 213 are protrusively provided. Those projecting pieces 207, 209, 211 and 213 have distal ends 207a, 209a, 211a and 213a which serve as lead terminals of a completed electroacoustic transducer. That is, the projecting pieces 207, 209, 211 and 213, when cut along cut lines A in FIG. 26, become the lead terminals 207a, 209a, 211a and 213a.

The aforementioned lead frame 201 has a structure as shown in FIG. 27 in which a plurality of lead frame elements 201a (four elements in this case) shown in FIG. 26 are coupled side by side. A base member 215 is formed on this lead frame 201. Specifically, as shown in FIGS. 27 and 28, the lead frame 201 is placed in a mold, and a yoke (base) 217 and the lead terminals 207a, 209a, 211a and 213a are formed by inserting (at this point of time, cutting along the cut lines A in FIG. 26 has not been carried out yet). At this time, the surface of the yoke 217 and the lands (soldering portions) of the lead terminals 207a, 209a, 211a and 213a are exposed. Note that a pole piece (core) 219 should have been formed previously in the center of the yoke 217.

Then, various parts should be assembled to the structure shown in FIGS. 27 and 28. First, a coil 221 is wound around the pole piece 219 of each lead frame element 201a, as shown in FIG. 29. Then, a support ring 223 is placed inside the base member 215, with a magnet 225 put in the ring 223. Then, a diaphragm 230, which has a magnetic piece 227 attached as an added mass to the center of an elastic plate 229, is set on the support ring 223. Next, both coil terminals 221a and 221b of the wound coil 221 are led on the lands of the lead terminals 207a and 209a and are soldered there and then cut away. The above-described work should be performed for all the lead frame elements 201a, thus yielding the state shown in FIG. 30.

As shown in FIG. 31, a case 231 should separately be formed of synthetic resin, and should be placed over the base member 215 of each lead frame element 201a. Next, the case 231 is securely welded to the base member 215 by ultrasonic welding as shown in FIG. 32. Through the work done up to this point, four electroacoustic transducers are fabricated on the lead frame 201. Finally, the projecting pieces 207, 209, 211 and 213 of each lead frame element 201a are cut along the cut lines A shown in FIG. 26 to separate the individual electroacoustic transducers from one another. Then, the lead terminals 207a, 209a, 211a and 213a of each electroacoustic transducer are subjected to a forming process, providing a completed electroacoustic transducer as shown in FIG. 33.

Each completed electroacoustic transducer is then mounted as informing means on an arbitrary electronic device such as a portable telephone or a pager. The electric connection on such an electronic device is generally made by reflow soldering.

The above-described conventional structure has the following shortcomings.

In general, an alloy such as brass or phosphor bronze is used for the above-described lead frame 201. Those copper alloys are characterized by their relatively low cost and high thermal conductivity. Those copper alloys contain a component like Zn or Be, which deteriorates the solder wetting property and which is precipitated on a soldered plated layer as time goes, thus hindering the solder wetting property. Conventionally, therefore, double plated layers of Ni and Cu are provided to suppress the precipitation of the component which hinders the solder wetting property.

The conventional lead frame 201, as has already been discussed above, is formed of an alloy of brass, phosphor bronze or the like which is relatively soft. Therefore, the required mechanical strength cannot be obtained unless the lead frame 201 is formed thicker to a certain degree.

The very fact that the material for the lead frame 201 has high thermal conductivity raises another problem. Specifically, in soldering both coil terminals 221a and 221b of the coil 221 to the lands of the lead terminals 207a and 209a, heat escapes from the lead terminals 207a and 209a toward the frame guide rails 203 of the lead frame 201. This impairs the local heating on the lands. It is therefore difficult to execute the desired soldering at the normal heating temperature, so that the heating temperature or the heating time is increased. When the heating temperature or the heating time is increased, however, resin parts in the vicinity of the lands may be damaged by the heat.

In mounting a completed electroacoustic transducer on the mount board of an arbitrary electronic device like a portable telephone or a pager, the reliability of the soldered portions of the coil decreases. As discussed above, the lead frame 201 has high thermal conductivity and is thick, so that heat is easily transferred to the inner portions of the lead terminals from the outer portions thereof at the time of soldering to the mounting board. Accordingly, solder on the previously-soldered portions of the coil terminals may be remelted, causing the coil terminal 221a and 221b to come off. In this respect, the melting temperature of solder should be set high enough that solder is not remelted by the heating temperature at the time an electroacoustic transducer is mounted on the mounting board.

SUMMARY OF THE INVENTION

Accordingly, it is an object of the present invention to provide an electroacoustic transducer, using an improved material and structure for lead terminals, which suppresses the precipitation of the component that hinders the solder wetting property, which ensures a thinner lead frame, which accelerates the local heating of lands at the time of soldering coil terminals to the associated lands to thereby make it unnecessary to increase the heating temperature or heating time, thus preventing resin parts in the vicinity of the lands from being thermally damaged, and which prevents the soldered portion from being remelted by heat at the time the electroacoustic transducer is mounted on the mount board of another arbitrary device.

To achieve the above object, according to one aspect of this invention, in an electroacoustic transducer having lead terminals, an outer case formed integral with the lead terminals and a drive section including a coil disposed in the outer case, the lead terminals are formed of an alloy consisting of 32 to 55% by weight of Ni and a remainder essentially of Fe, and having a crystal grain size number of 7.0 or greater.

In this electroacoustic transducer, the lead terminals may be formed of an alloy consisting of 32 to 55% by weight of Ni, 1.0% or less by weight of Mn, 1.0% or less by weight of Si, 0.05% or less by weight of C and a remainder essentially of Fe, and having a crystal grain size of number 7.0 or greater.

Further, as a material for the lead terminals, other than essential impurity elements, one or two or more of Al, Ti, V, Nb, Ta, Cr, Co, Cu, Mo, W and B may be added by a total amount of 0.01 to 2.0% by weight.

According to another aspect of this invention, an electroacoustic transducer having lead terminals, an outer case formed integral with the lead terminals and a drive section including a coil disposed in the outer case, wherein both coil terminals of the coil are connected to associated lands of the lead terminals, and thermal conduction suppressing sections are provided at proximal end sides of lands of the lead terminals for suppressing thermal conduction.

In this electroacoustic transducer, the thermal conduction suppressing sections may be narrow portions at the proximal ends of the lands.

Further, the thermal conduction suppressing sections may be openings provided at the proximal ends of the lands.

Furthermore, the thermal conduction suppressing sections may be narrow portions and openings at the proximal ends of the lands.

The electroacoustic transducer according to this invention may be an electromagnetic type.

According to the electroacoustic transducer embodying this invention, an improved material is used for the lead frame to suppress the precipitation of the component that hinders the solder wetting property, so that single plating is sufficient and the desired mechanical strength can be acquired even if the lead frame is formed thin.

The thermal conductivity is reduced to suppress heat discharge at the soldering time so that the lands can be locally heated. It is thus possible to efficiently execute local heating on the lands, thus eliminating the conventional requirement for increasing the heating temperature or the heating time at the soldering time. This can prevent resin parts in the vicinity of the lands from being thermally damaged.

Similar advantages can be acquired by providing the thermal conduction suppressing sections at the proximal ends of the lands.

Moreover, thermal transfer from the outer portions of the lead terminals to the inner portions is suppressed even when a completed electroacoustic transducer is mounted on the mount board of an arbitrary electronic device. This prevents the previously soldered portion from being remelted by heat at the time of mounting the electroacoustic transducer.

BRIEF DESCRIPTION OF THE DRAWINGS

FIG. 12 is a diagram showing examples of this invention in comparison with comparative examples for explaining the action and advantages of the first embodiment;

FIG. 29 is an exploded perspective view of the prior art showing how to assemble a support ring, a magnet and an elastic plate after the base member is formed integral with the lead frame by inserting;

DETAILED DESCRIPTION OF THE PREFERRED EMBODIMENTS

First Embodiment

Figure 1:
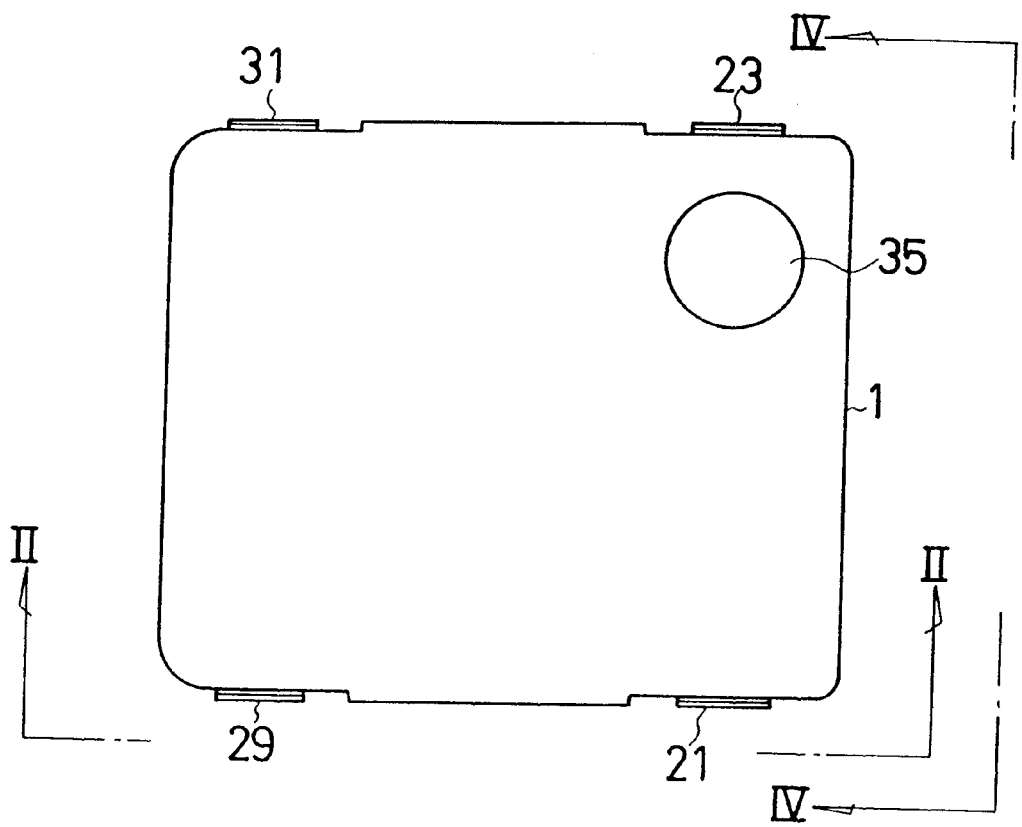
FIG. 1 is a plan view of an electroacoustic transducer according to the first embodiment of this invention.

The first embodiment of the present invention will now be described with reference to FIGS. 1 through 12. To begin with, the structure of an electromagnetic type electroacoustic transducer according to this embodiment will be discussed referring to FIGS. 5 and 6. A case 1 has a base member 3 attached to its bottom. A base 5 and a core 7 are integrally secured on the base member 3 and inside the case 1. The integration of the base 5 and the core 7 is called "pole piece." A coil 9 is wound around the core 7. A support ring 11 is disposed around the coil 9, and a magnet 13 is provided on the inner wall of the support ring 11. A ring-like clearance is formed between the magnet 13 and the coil 9. Formed at the left-hand end portion of the support ring 11 in FIG. 6 is a step portion 15 at which a diaphragm 16 is provided. This diaphragm 16 comprises an elastic plate (also called a resonance plate) 17 and a magnetic piece 19 attached as an added mass to the center portion of this elastic plate 17.

Figure 5:
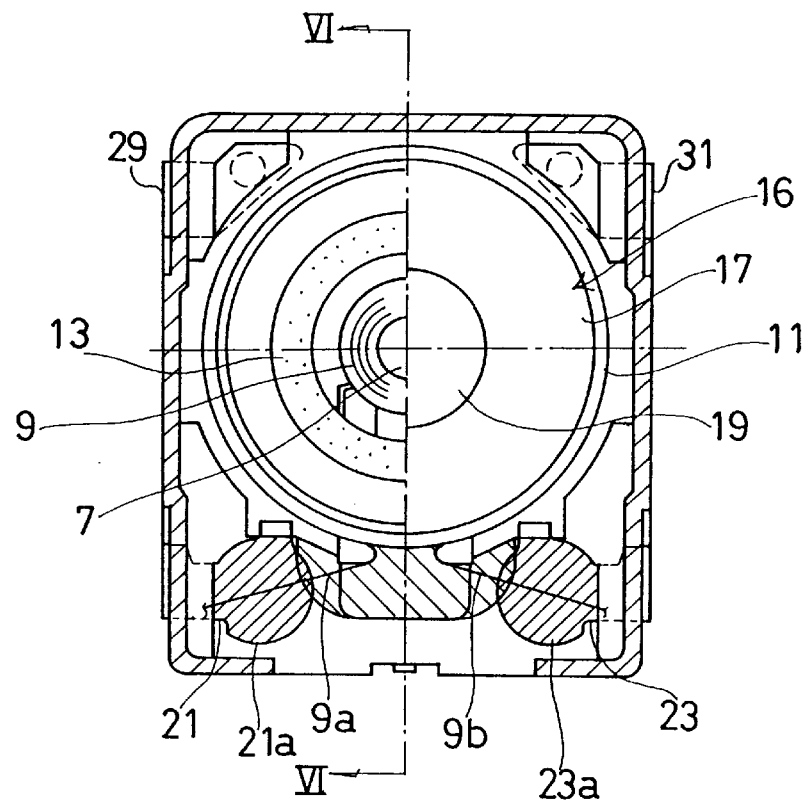
FIG. 5 is a plan view of the electroacoustic transducer according to the first embodiment, showing an elastic plate and an added mass with a part of a case removed, and showing a magnet and the like with parts of the elastic plate and added mass removed.
Figure 6:
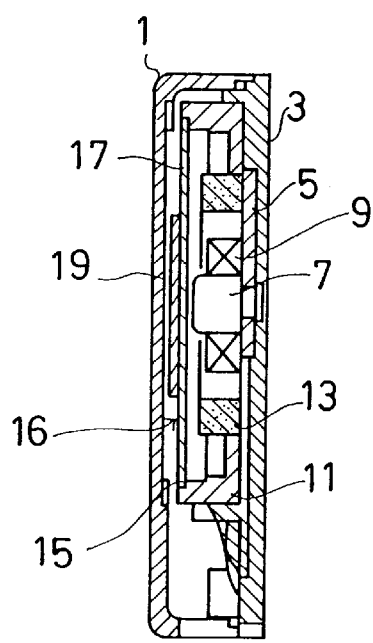
FIG. 6 is a cross-sectional view of the first embodiment taken along the line VI—VI in FIG. 5.

In the thus constituted electromagnetic type electroacoustic transducer, as shown in FIG. 5, lead terminals 21 and 23 have previously been attached in an integral manner to the base member 3 by inserting. In this case, as shown in FIG. 5, both coil terminals 9a and 9b of the coil 9 are led out on lands 21a and 23a of the lead terminals 21 and 23 and are securely soldered to those lands.

Figure 7:
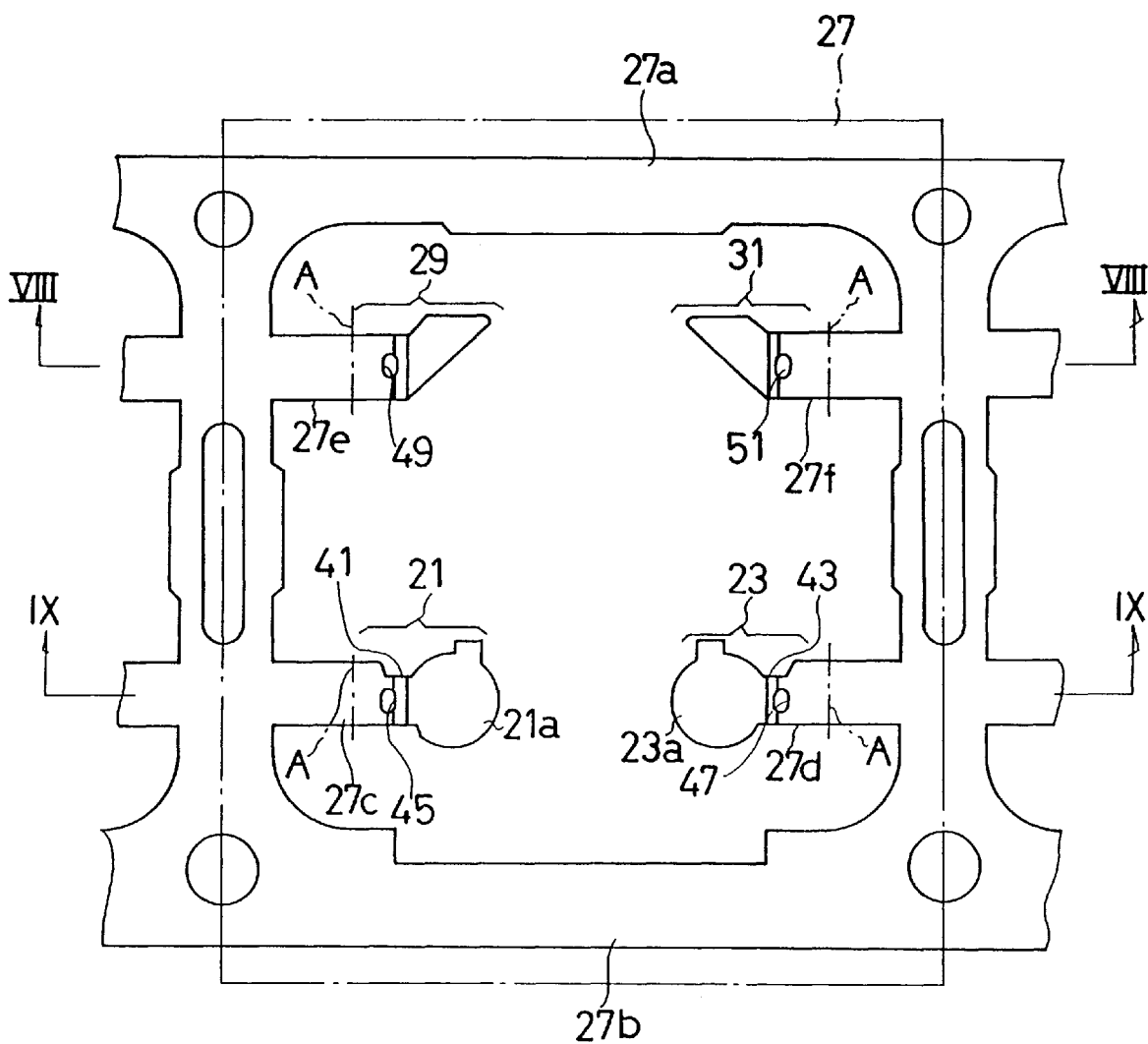
FIG. 7 is a plan view showing the structure of a single lead frame element of a lead frame according to the first embodiment.
Figure 8:
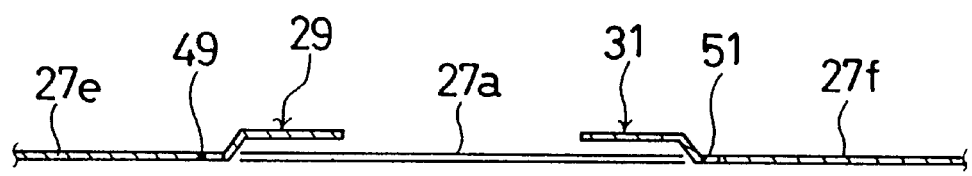
FIG. 8 is a cross-sectional view of the first embodiment taken along the line VIII—VIII in FIG. 7.
Figure 9:
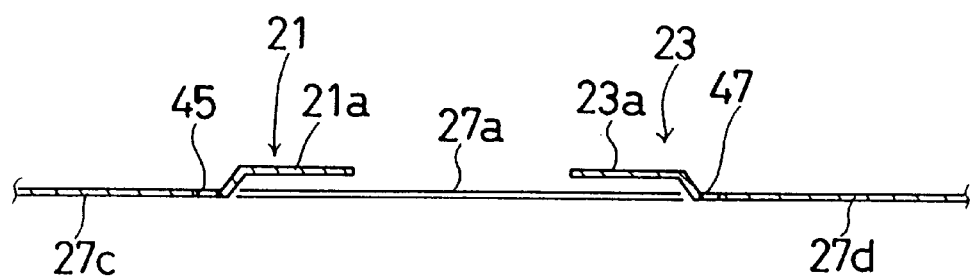
FIG. 9 is a cross-sectional view of the first embodiment taken along the line IX—IX in FIG. 7.
Figure 10:
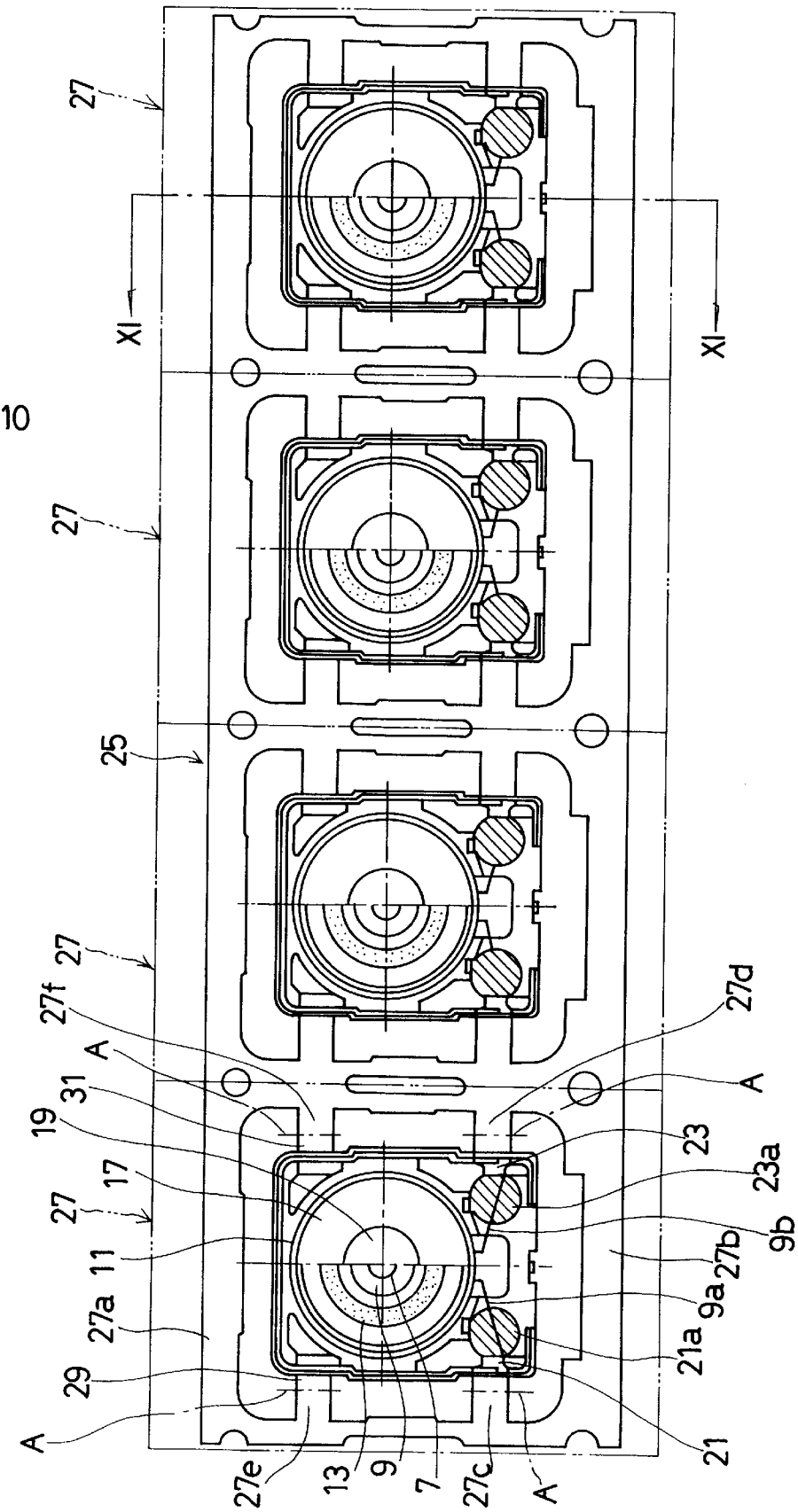
FIG. 10 is a plan view showing the structure of the lead frame according to the first embodiment.
Figure 11:
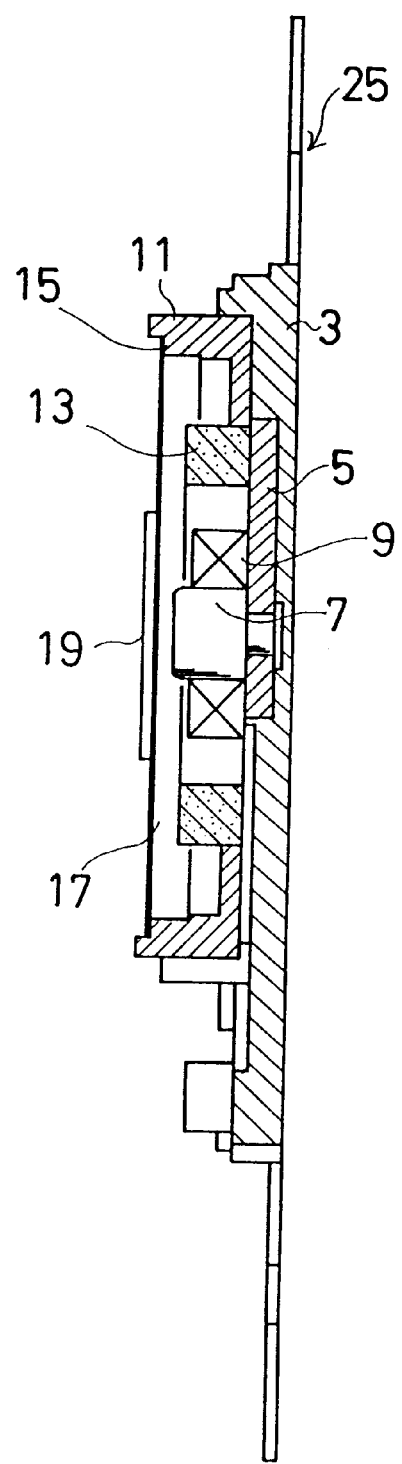
FIG. 11 is a cross-sectional view of the first embodiment taken along the line XI—XI in FIG. 10.

The aforementioned inserting method will now be discussed specifically. As shown in FIG. 10, a lead frame 25 previously patterned in a predetermined shape is prepared. The lead frame 25 has a plurality of lead frame elements 27 (surrounded by an alternate one long and two short dashes line in FIG. 10) coupled side by side, so that a plurality of electromagnetic type electroacoustic transducers (four electroacoustic transducers in this case) are manufactured at the same time. FIG. 7 shows the details of the lead frame element 27. The lead frame element 27 has a pair of frame guide rails 27a and 27b extending horizontally in FIG. 7, and protruding pieces 27c, 27d, 27e and 27f are provided between the pair of frame guide rails 27a and 27b. The distal end portions of the protruding pieces 27c and 27d become the aforementioned lead terminals 21 and 23.

As shown in FIG. 10, one constituting element of each electromagnetic type electroacoustic transducer, specifically the pole piece, is placed at the proper positions of the lead frame elements 27 of the lead frame 25 in a mold (not shown). Then, a resin is filled in the mold to form the aforementioned base member 3, at which time the lead frame elements 27 partially become integrated with the interior of the base member 3. Thereafter, the remaining components, namely the coil 9, the support ring 11, the magnet 13 and the diaphragm 16, are placed at the proper positions and the case 1 is securely attached to the base member 3. Then, the lead frame elements 27 are cut along cut lines A shown in FIG. 7 and the exposed portions are bent, providing the state shown in FIGS. 1 to 4. Besides the lead terminals 21 and 23, terminal members 29 and 31 which do not perform electric functions are likewise integrated with the base member 3, as shown in FIG. 7. That is, the distal end portions of the protruding pieces 27e and 27f shown in FIG. 7 become the terminal members 29 and 31.

The procedures for the insert formation are the same as those of the prior art illustrated in FIGS. 27–33.

Figure 4:
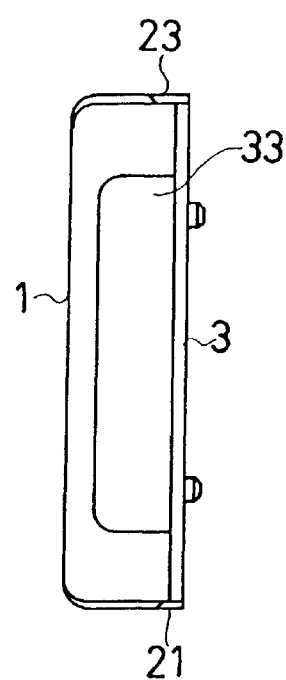
FIG. 4 is a diagram of the first embodiment as viewed from the line IV—IV in FIG. 1.

The appearance of the electromagnetic electroacoustic transducer is illustrated in FIGS. 1 through 4. As shown in FIG. 4, formed in one side of the case 1 is a sound port 33 through which sounds are output outside. As shown in FIG. 1, a polarity mark 35 indicative of a polarity is inscribed on the top of the case 1.

In the thus constituted electromagnetic type electroacoustic transducer, the elastic plate 17 integrally provided with the magnetic piece 19 is set to have a given polarity by the magnet 13. When a current flows across the coil 9 via the lead terminals 21 and 23 under this situation, the core 7 is magnetized, generating a magnetic field at the distal end. When the magnetic pole of the core 7 induced by the coil 2 is different from the magnetic pole induced by the magnet 13 attached to the elastic plate 17, the elastic plate 17 is attracted to the core 7. When the former magnetic pole of the core 7 is the same as the latter magnetic pole induced by the magnet 13, the elastic plate 17 is repelled away from the core 7. By allowing the current to intermittently flow in either direction, therefore, the elastic plate 17 repeats the above-described operation. In other words, the elastic plate 17 vibrates at a given frequency, thus generating a sound.

Figure 2:
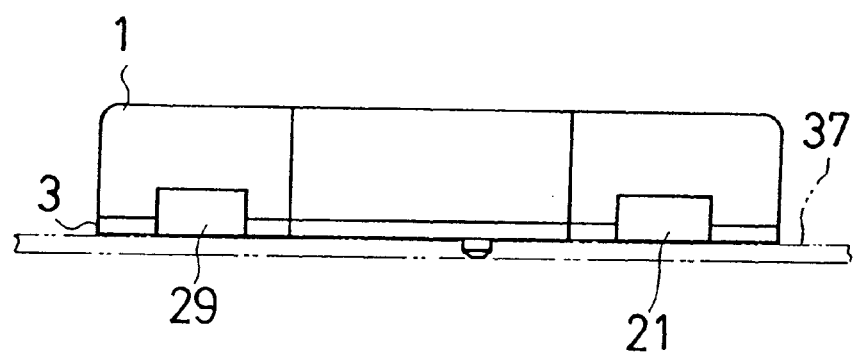
FIG. 2 is a diagram of the first embodiment as viewed from the line II—II in FIG. 1.
Figure 3:
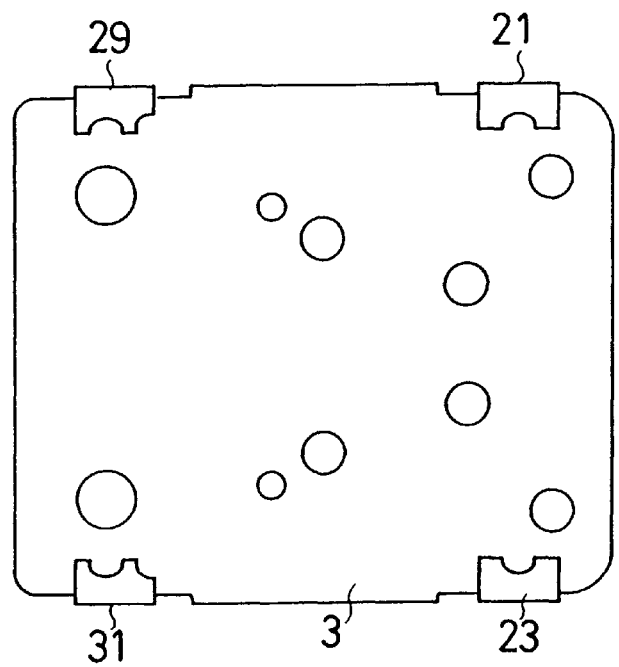
FIG. 3 is a bottom view of the electroacoustic transducer according to the first embodiment.

This electromagnetic type electroacoustic transducer is then to be incorporated into any desired device, such as a portable telephone or a pager. To accomplish this, as shown in FIG. 2, this electroacoustic transducer is attached to a mounting board 37 (indicated by an alternate one long and two short dashes line in FIG. 2) of the electronic device in the illustrated manner, and is soldered thereto via the lead terminals 21 and 23 and the lead terminals 29 and 31 which do not perform electric functions.

The lead frame 25 according to this embodiment will now be described more specifically. To begin with, the material for the lead frame 25 will be discussed. The material for the lead frame 25 consists of 32 to 55% by weight of Ni, 1.0% or less by weight of Mn, 1.0% or less by weight of Si, 0.05% or less by weight of C, an essential impurity, and a remainder essentially of Fe, and has a crystal grain size number of 7.0 or greater.

As a material other than essential impurity elements, one or two or more of Al, Ti, V, Nb, Ta, Cr, Co, Cu, Mo, W and B may be added by a total amount of 0.01 to 2.0% by weight.

Adding such a material can increase the mechanical strength of the alloy that constitutes the frame member and can make the lead frame as thin as approximately 0.13 mm, so that a deformation preventing effect can be expected. The reason for setting the crystal grain size number to 7.0 or greater is to prevent deformation during a fine press work of the lead frame which has been made thin.

After an Fe-Ni alloy such as an Fe-Ni alloy essentially consisting of Fe and 36% by weight of Ni, an Fe-Ni alloy essentially consisting of Fe and 42% by weight of Ni, and an Fe-Ni alloy essentially consisting of Fe and 50% by weight of Ni was subjected to vacuum melting, the resultant alloy was subjected to casting, forging and hot rolling, and then to repetitive cold rolling and annealing, thus yielding rolled members having a thickness of 0.13 mm as the lead frame 25. As another example, after an Fe-Ni alloy essentially consisting of Fe, 29% by weight of Ni and 17% by weight of Co was subjected to vacuum melting, the resultant alloy was subjected to casting, forging and hot rolling, and then to repetitive cold rolling and annealing, thus yielding a rolled member having a thickness of 0.13 mm.

Each of those rolled members was then subjected to a predetermined press work to yield the lead frame 25.

The shape of the lead frame 25 will now be discussed. Let us now look at the portions of the projecting pieces 27c and 27d which serve as the lead terminals 21 and 23 in FIG. 7. Proximal ends 41 and 43 of the lands 21a and 23a are made narrower with oval holes 45 and 47 formed there. Narrowing the proximal ends 41 and 43 and forming the holes 45 and 47 there suppress the thermal conduction from the lands 21a and 23a and accelerate local heating on the lands 21a and 23a at the soldering time.

Oval holes 49 and 51 are likewise formed in the lead terminals 29 and 31, dummy terminals which do not electrically serve, in order to balance the heat volumes of the individual lead terminals 21, 23, 29 and 31 when a completed electroacoustic transducer is securely attached to the mounting board 37 in the state shown in FIG. 2.

The above point will be described below more specifically. According to the prior art, when a completed electroacoustic transducer is mounted on the mounting board of an arbitrary electronic device by reflow soldering, improper soldering such as misalignment may occur for the following reason. The heat is easily transferred from the outer portions of the lead terminals to the inner portions at the soldering time so that whole lead terminals are heated. Because the volume (thermal capacity) of the entire lead terminals on the side where the coil terminals are soldered differs from that of the entire dummy lead terminals, the time for melting solder for the former lead terminals may differ from the solder melting time for the latter lead terminals depending on the soldering conditions. This may result in improper soldering such as misalignment.

According to this embodiment, by way of comparison, the lead frame has lower thermal conductivity and becomes thinner, and the thermal conduction suppressing sections are provided. This design makes it difficult for heat to be transferred from the outer portions of the lead terminals to the inner portions at the soldering time so that only the outer portions of the lead terminals which are to be soldered are heated, thus overcoming the above-discussed problem. As the thermal conduction suppressing sections are provided on the dummy lead terminals 29 and 31, the volumes (thermal capacitances) of the terminals to be heated can be balanced out, thus preventing the occurrence of improper soldering such as misalignment.

This embodiment has the following advantages. First, a description will be given of the results of tests for explaining the advantages from the view point of the material for the lead frame 25. Test pieces were prepared from unpressed lead frame members, electroacoustic transducers were produced using the actual lead frame 25, and they were subjected to an evaluation test. The test pieces, which were strips having a width of 10 mm in the rolling direction and a length of 100 mm, are illustrated as Examples 1 to 4 in FIG. 12.

A material property test and evaluation test were conducted on those test pieces and electroacoustic transducers. The contents of the tests are as follows; items a to e were conducted in the test concerning the material properties while items f to h were conducted in the evaluation test. Based on those items, general evaluation was made.

a: tensile test
    b: 0.2% yield strength
    c: Vickers hardness
    d: crystal grain size
    e: thermal conductivity
    f: deformation in pressing
    g: damage on resin when soldering coil terminals
    h: solder wetting property ("good" indicates wetting of 95% or more as a result of leaving the test pieces at 150° C. for 24 hours and then dipping them in melted solder of the melting temperature of 235° C. for two seconds) i: general evaluation ("good" was given when the results of all the evaluation test items f to h were "good")

As apparent from FIG. 12, the material for the lead frame 25 in this embodiment has a higher mechanical strength than the copper alloy used in the prior art, so that it can avoid deformation or the like in the press work and the assembling stage. The lead frame 25 can therefore be made thinner. Since this material had lower thermal conductivity than the copper alloy, thermal conduction from the lands 21a and 23a at the soldering time could be suppressed, thus permitting local heating on the lands 21a and 23a. This eliminated the need for increasing the heating temperature and the heating time, and could thus reduce the amount of heat required for the soldering work. Thermal damages on resin parts located in the vicinity of the lands 21a and 23a can therefore be prevented effectively.

Note that the soldering time was reduced by 64% to 1.6 seconds from 2.5 seconds which was needed conventionally.

Further, no degradation of the solder wetting property was seen in the 24-hour aging test at 150° C. Since there is less precipitation of the component that hinders the solder wetting property, single plating is sufficient.

Furthermore, the lead frame has lower thermal conductivity and becomes thinner, and the thermal conduction suppressing sections are provided, so that it becomes difficult for heat to be transferred from the outer portions of the lead terminals to the inner portions even when a completed electroacoustic transducer is mounted by solder onto the mounting board of an arbitrary electronic device. Therefore, solder even on the coil terminals which have previously been soldered will not be melted by heat.

A description will now be given of the advantages of the particular shape of the lead frame 25, i.e., the provision of the narrow portions 41 and 43 and the holes 45 and 47 at the proximal ends of the lands 21a and 23a. The provision of the narrow portions 41 and 43 and the holes 45 and 47 at the proximal ends of the lands 21a and 23a reduces the mass of the portions which contribute to thermal conduction at the soldering time. In the case where both coil terminals 21a and 21b of the coil 21 are soldered to and along the respective lands 21a and 23a, therefore, thermal conduction is suppressed, thus permitting local heating of the lands 21a and 23a. In other words, the lands 21a and 23a can be locally heated. This can eliminate the need for increasing the heating temperature and the heating time, and can thus reduce the amount of heat required in the soldering work. It is therefore possible to effectively prevent thermal damages on resin parts located in the vicinity of the lands 21a and 23a.

The same is true of the case where a completed electroacoustic transducer is securely soldered to the mounting board 37. In this case, though the opposite ends of the lands 21a and 23a of the lead terminals 21 and 23 are heated, solder on the coil terminals which has previously been soldered does not melt by the heat because the lead frame 25 is designed to make thermal transfer to the lands 21a and 23b or the internal components difficult.

The same applies to the lead terminals 29 and 31; the provision of the holes 49 and 51 reduces the mass of the portion which contributes to thermal conduction to balance the volumes (thermal capacitances) of the terminals to be heated, thus preventing the occurrence of improper soldering such as misalignment.

Second Embodiment

The second embodiment of the present invention will now be described with reference to FIGS. 13 through 25. To begin with, the structure of an electromagnetic type electroacoustic transducer according to this embodiment will be discussed referring to FIGS. 18 and 19. A case 101 has a base member 103 attached to its bottom. A base 105 and a core 107 are integrally secured on the base member 103 and inside the case 101. The integration of the base 105 and the core 107 is called "pole piece." A coil 109 is wound around the core 107. A support ring 111 is disposed around the coil 109, and a magnet 113 is provided on the inner wall of the support ring 111. A ring-like clearance is formed between the magnet 113 and the coil 109. Formed at the left-hand end portion of the support ring 111 in FIG. 6 is a step portion 115 at which a diaphragm 116 is provided. This diaphragm 116 comprises an elastic plate (also called a resonance plate) 117 and a magnetic piece 119 attached as an added mass to the center portion of this elastic plate 117.

Figure 18:
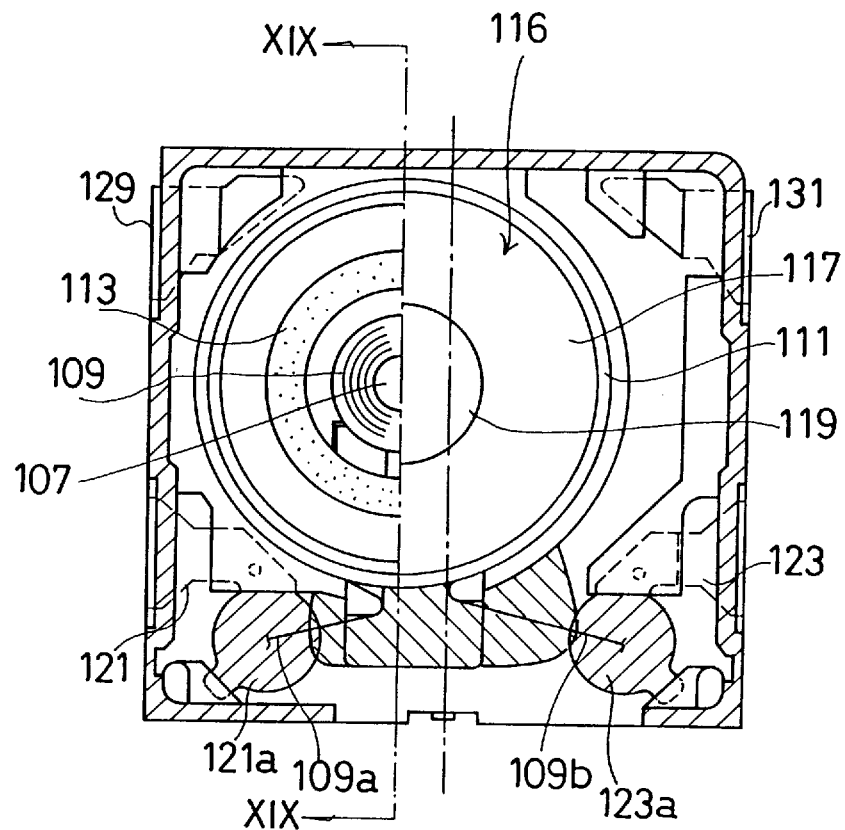
FIG. 18 is a plan view of the electroacoustic transducer according to the second embodiment, showing an elastic plate and an added mass with a part of a case removed, and showing a magnet and the like with parts of the elastic plate and added mass removed.
Figure 19:
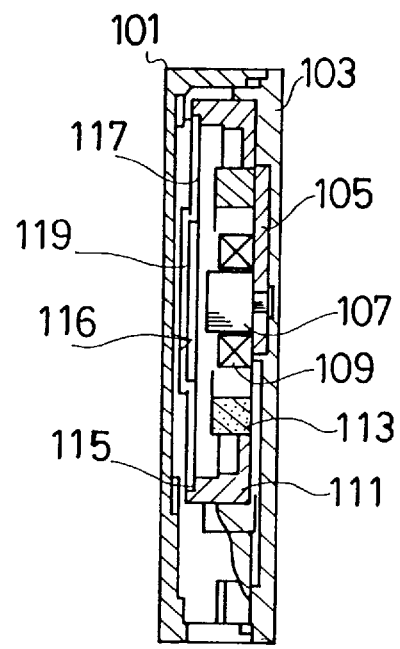
FIG. 19 is a cross-sectional view of the second embodiment taken along the line XIX—XIX in FIG. 18.

In the thus constituted electromagnetic type electroacoustic transducer, as shown in FIG. 18, lead terminals 121 and 123 have previously been attached in an integral manner to the base member 103 by inserting. In this case, as shown in FIG. 18, both coil terminals 109a and 109b of the coil 109 are led out on lands 121a and 123a of the lead terminals 121 and 123 and are securely soldered to those lands.

Figure 20:
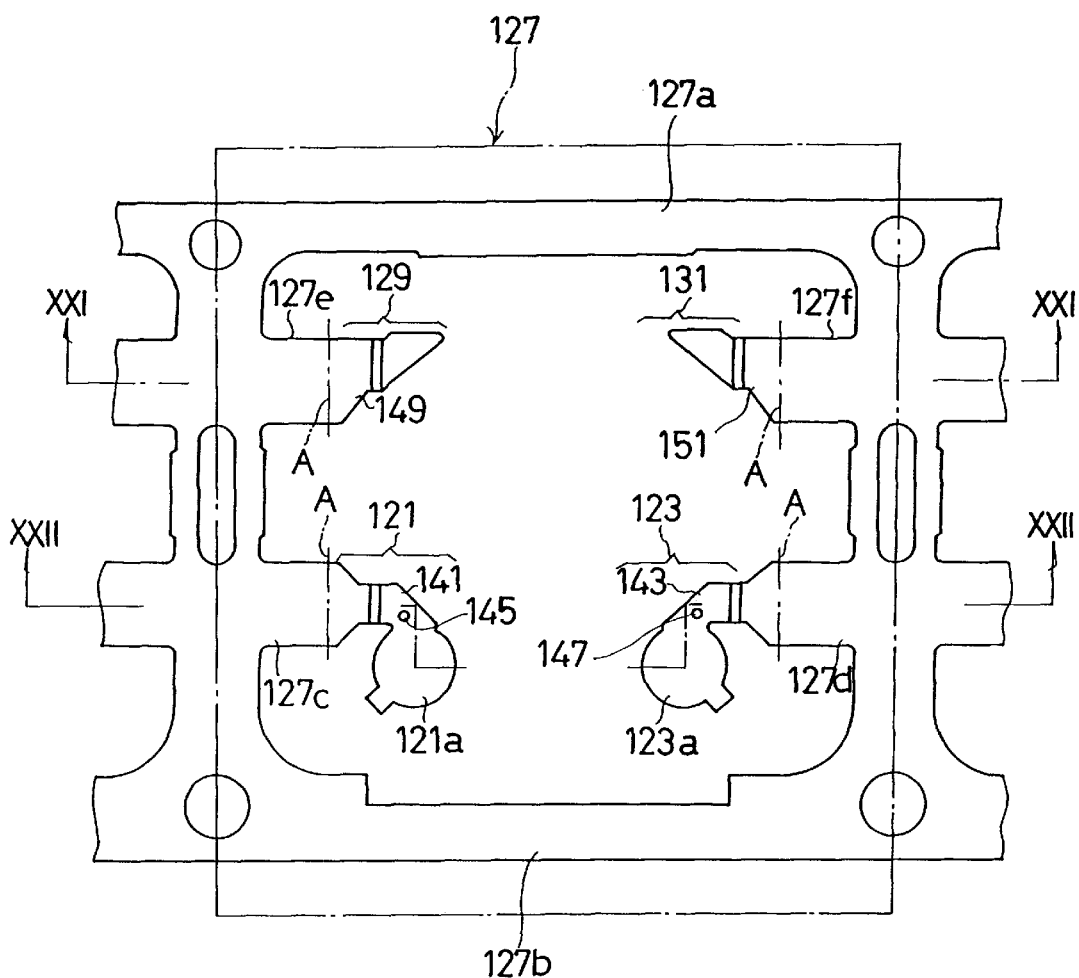
FIG. 20 is a plan view showing the structure of a single lead frame element of a lead frame according to the second embodiment.
Figure 21:
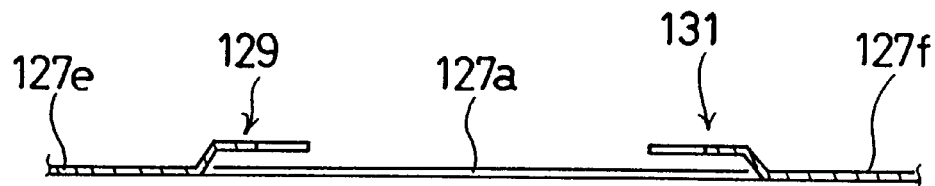
FIG. 21 is a cross-sectional view of the second embodiment taken along the line VIII—VIII in FIG. 7.
Figure 22:
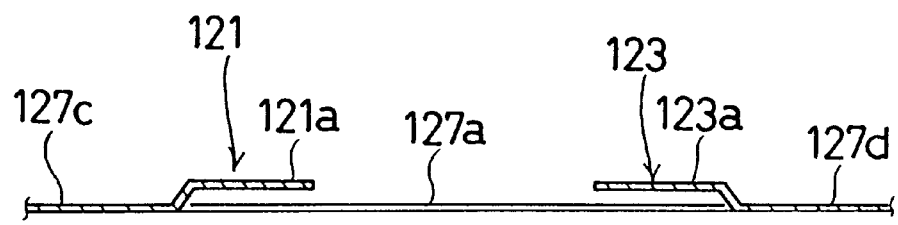
FIG. 22 is a cross-sectional view of the second embodiment taken along the line XXII—XXII in FIG. 20.
Figure 23:
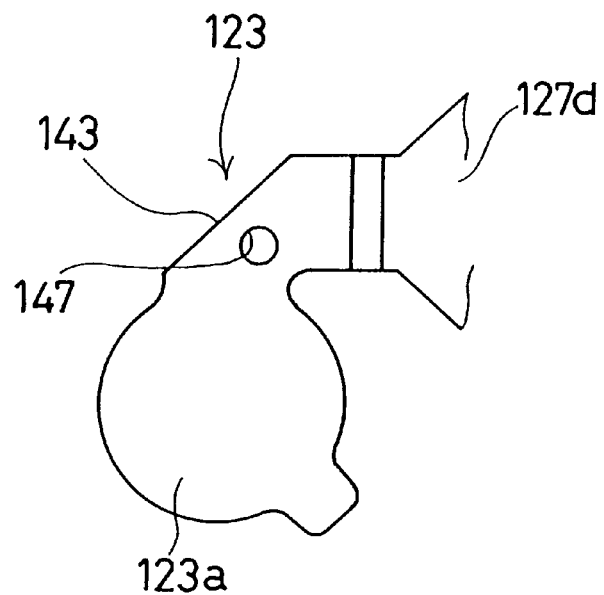
FIG. 23 is a plan view showing the structure of the lead terminals according to the second embodiment.
Figure 24:
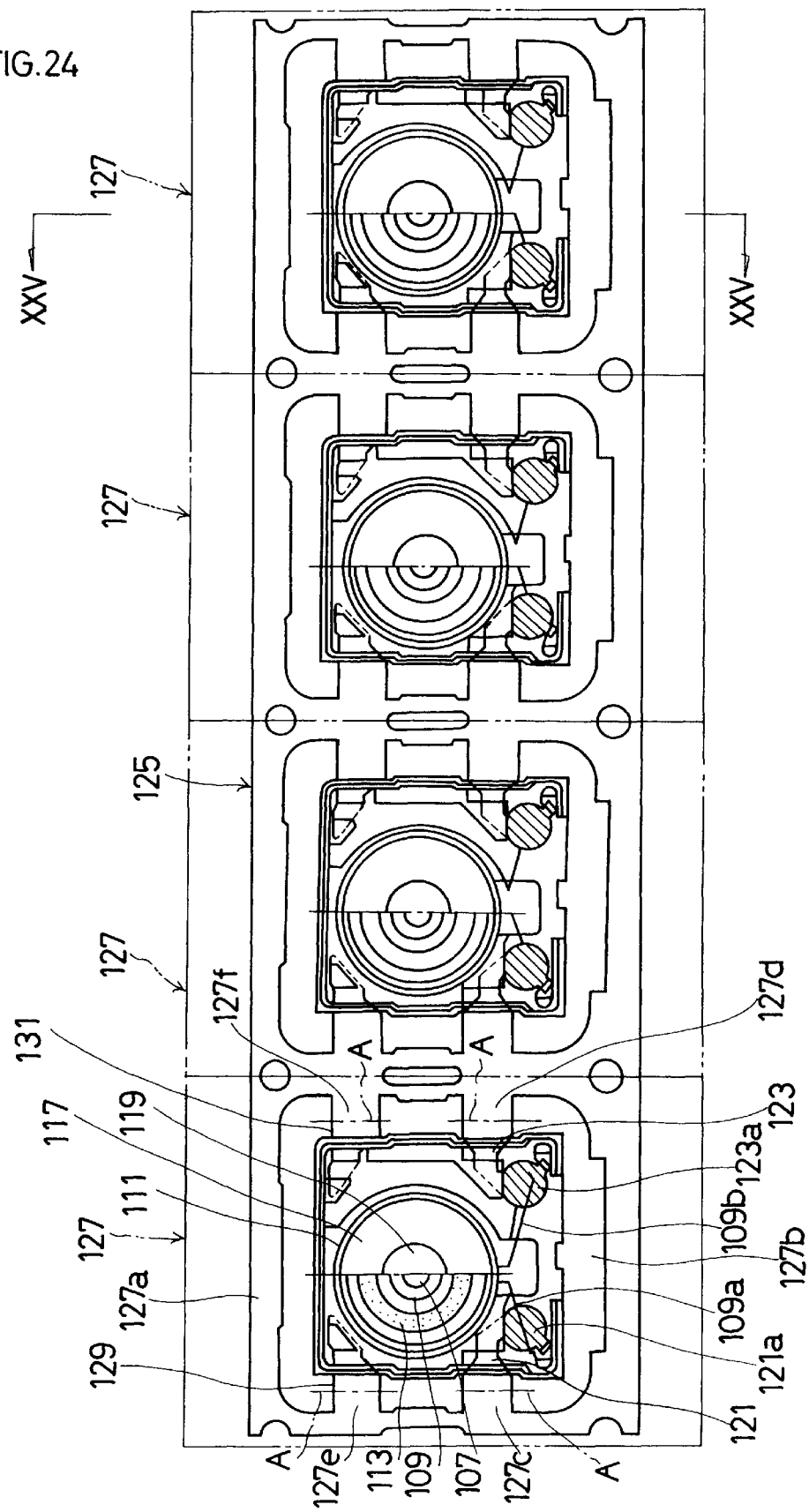
FIG. 24 is a plan view showing the structure of the lead frame according to the second embodiment.
Figure 25:
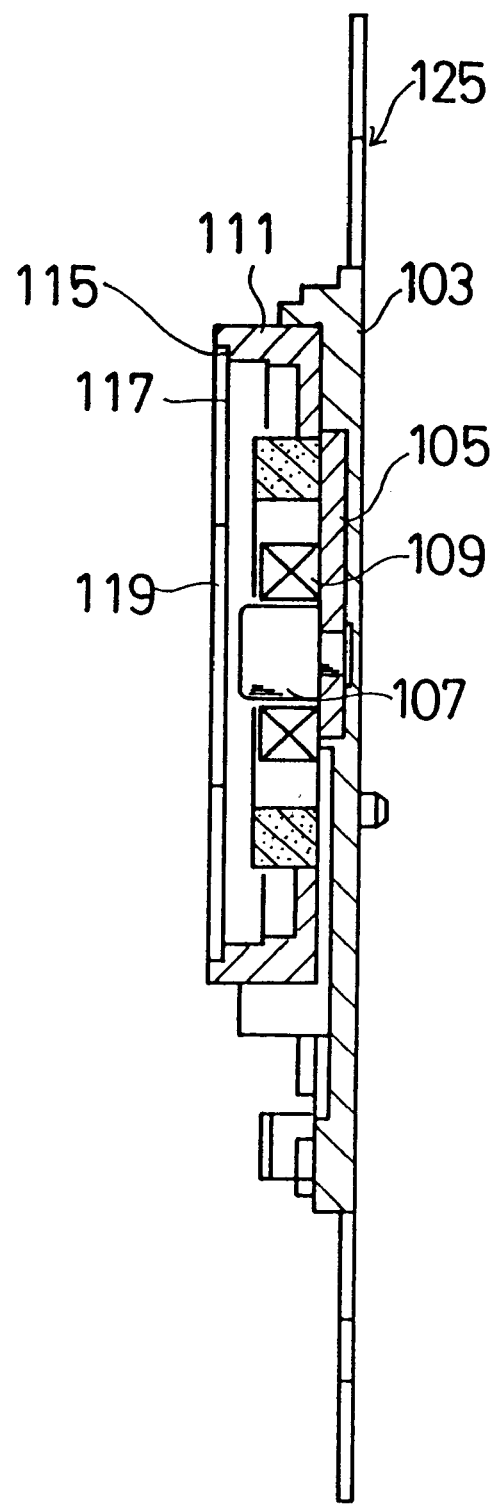
FIG. 25 is a cross-sectional view of the second embodiment taken along the line XXV—XXV in FIG. 24.
Figure 26:
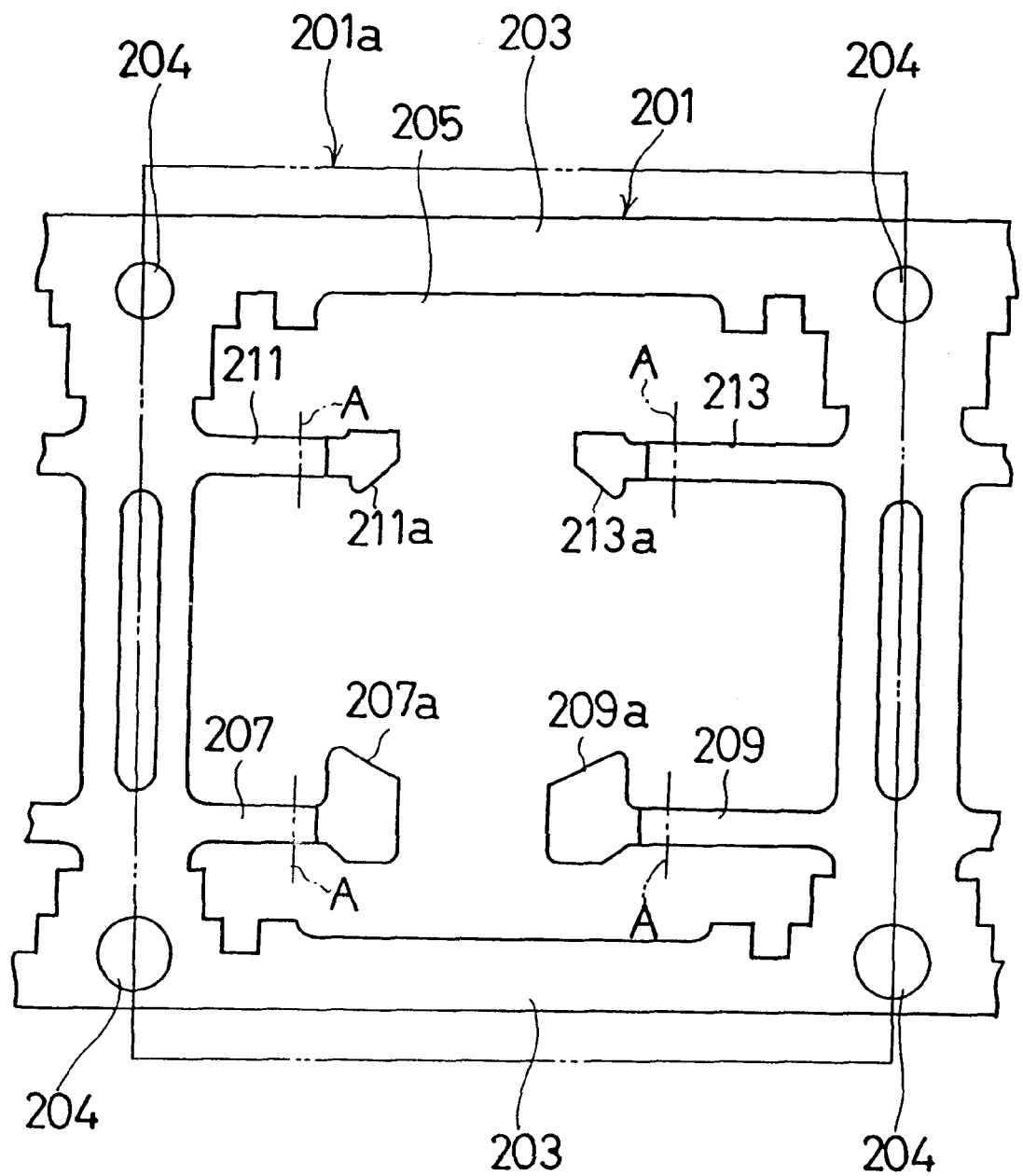
FIG. 26 is a plan view showing the structure of a single lead frame element of a lead frame according to the prior art.
Figure 27:
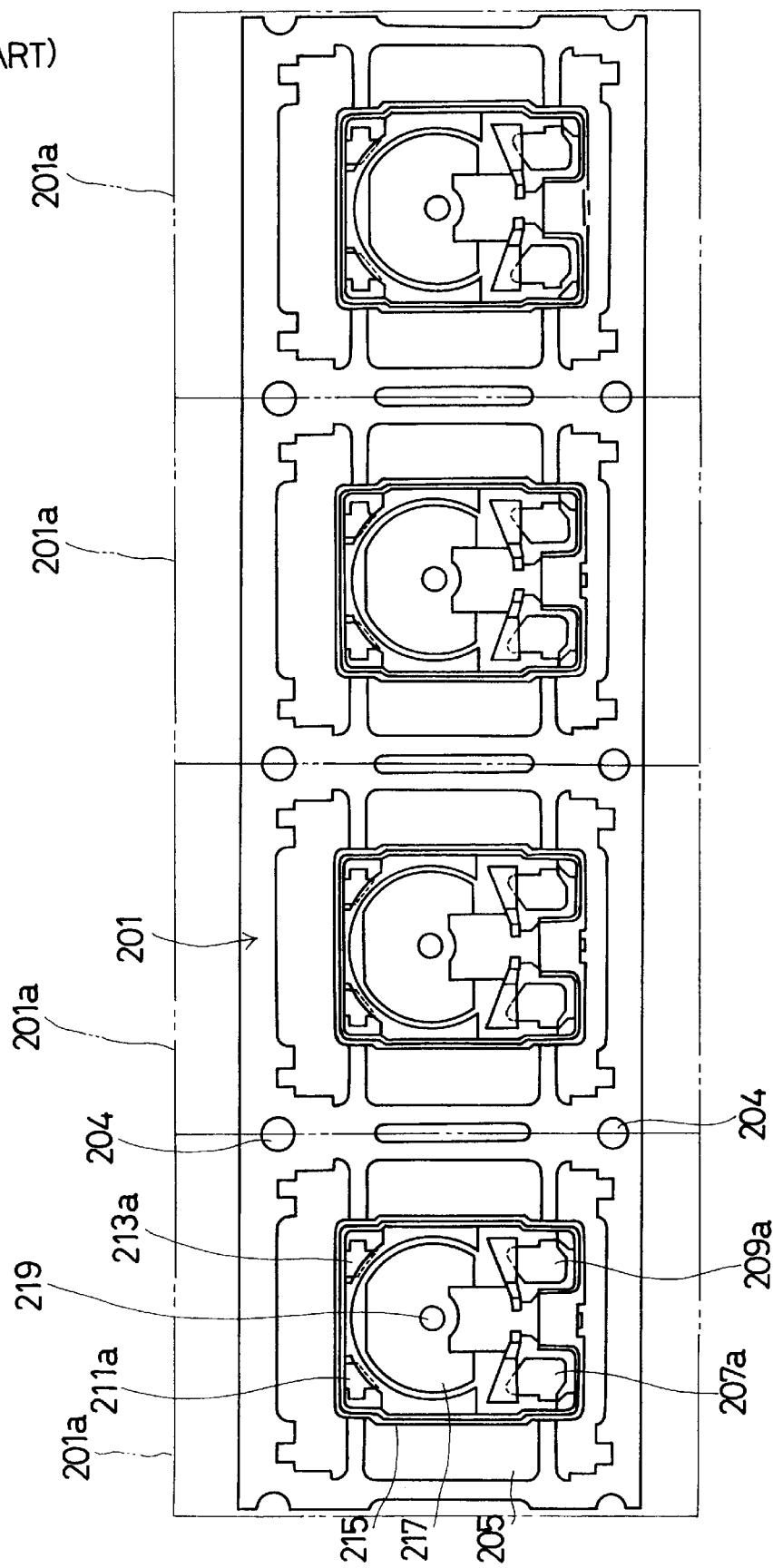
FIG. 27 is a plan view showing the structure of the lead frame according to the prior art.
Figure 28:
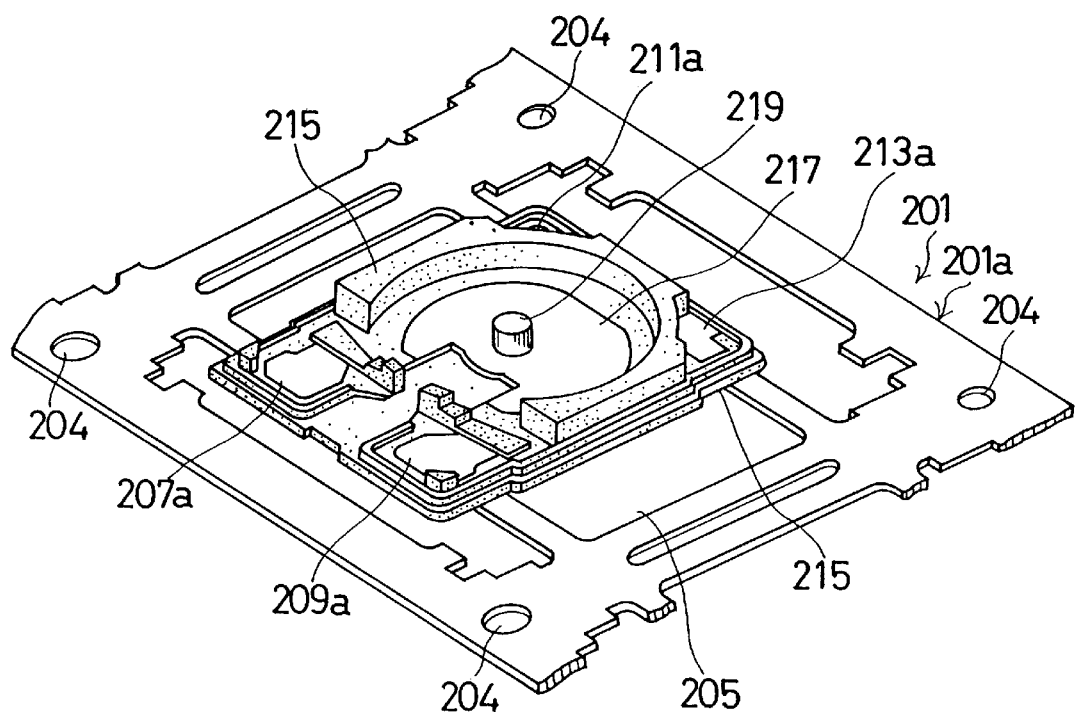
FIG. 28 is a perspective view of the prior art showing a base member formed integral with the lead frame by inserting.
Figure 30:
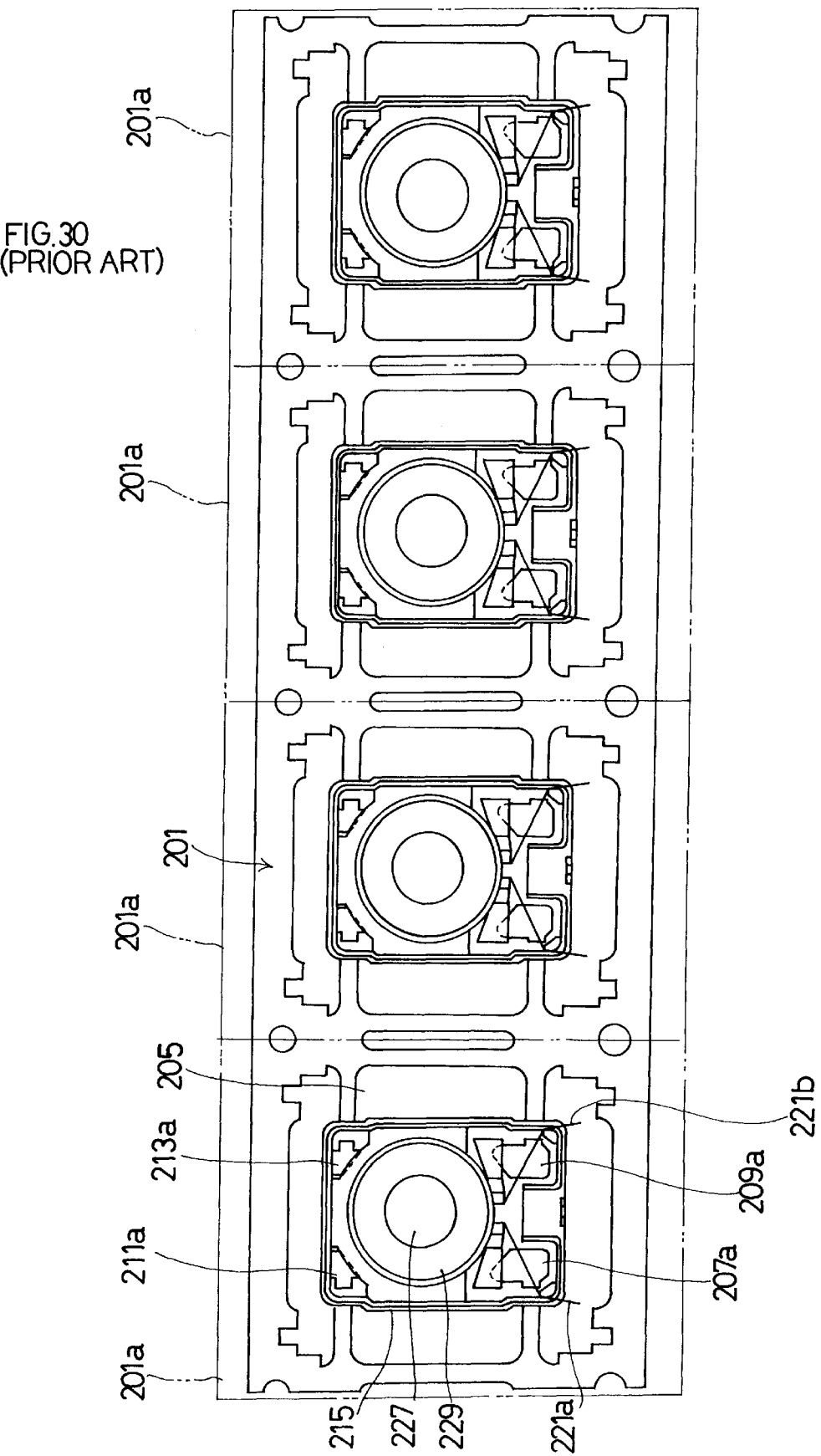
FIG. 30 is a plan view of the prior art showing individual components assembled to each lead frame element of the lead frame.
Figure 31:
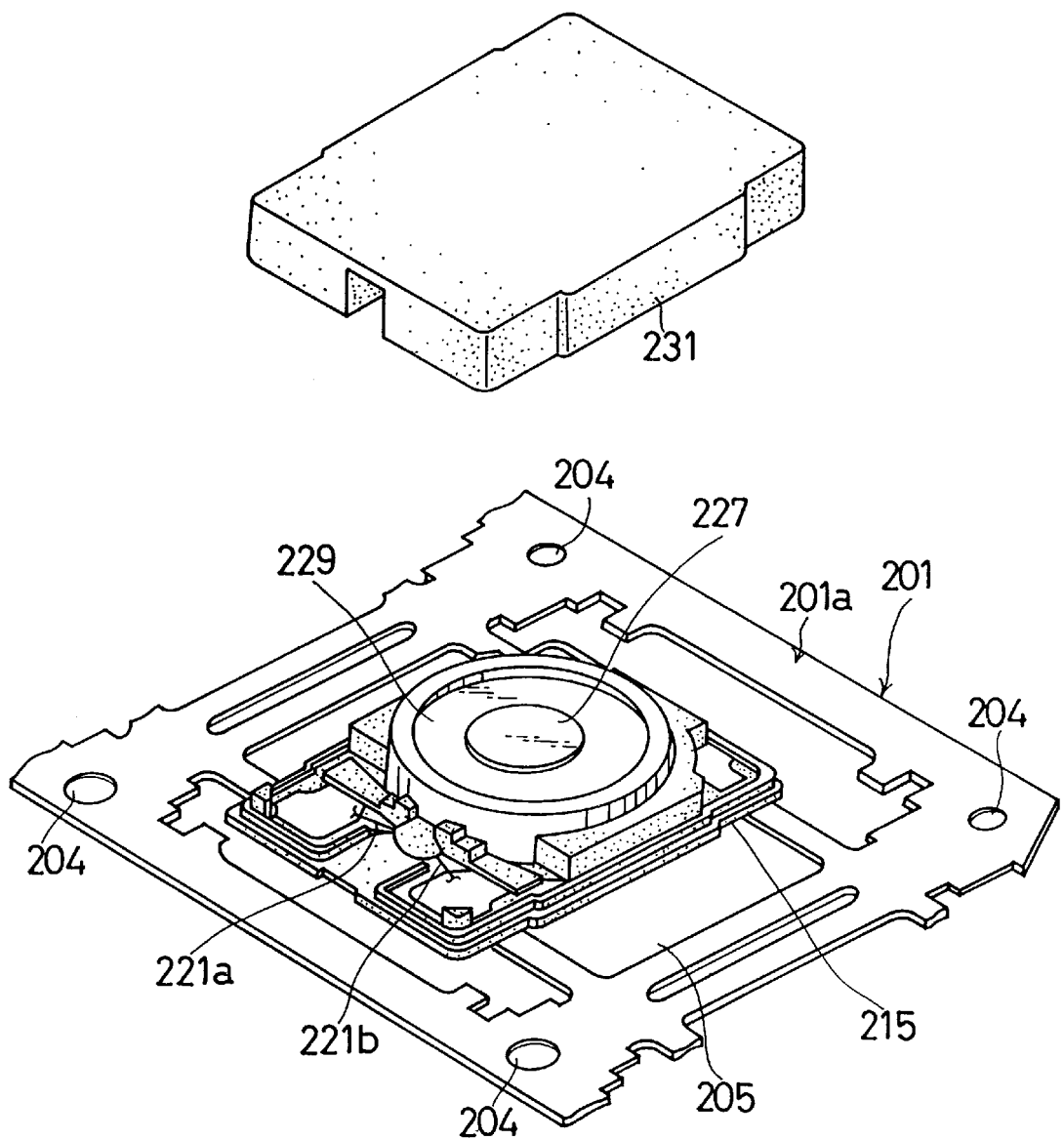
FIG. 31 is an exploded perspective view of the prior art showing how to securely attach a case after assembling the individual components to each lead frame element of the lead frame.
Figure 32:
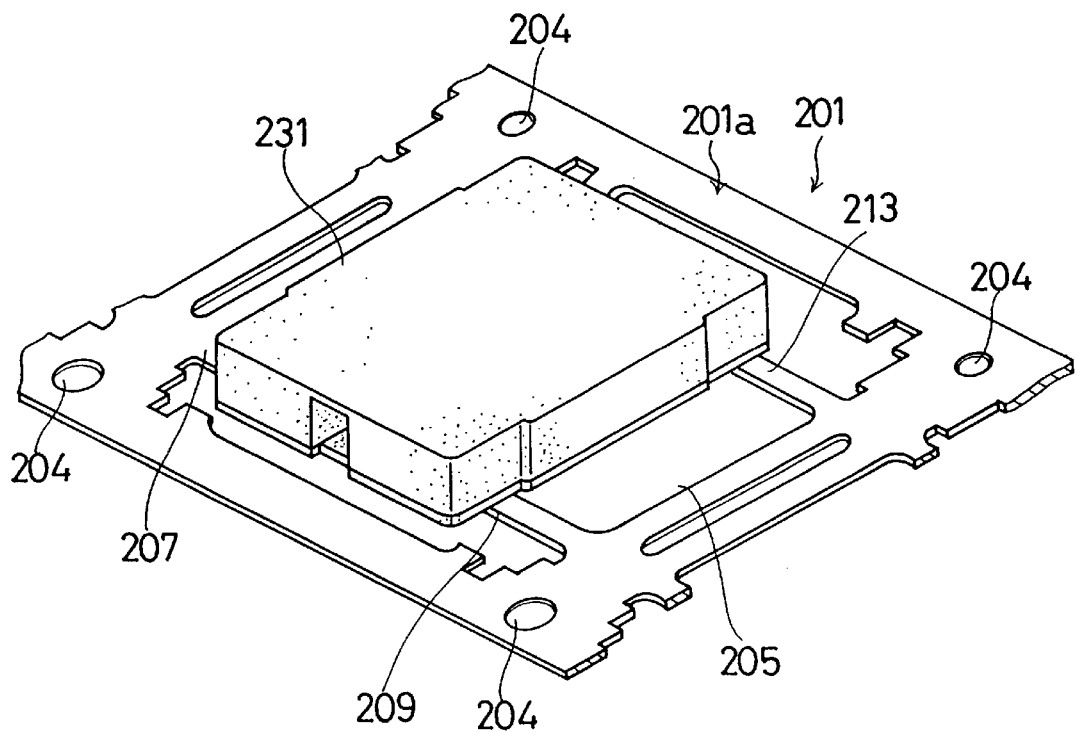
FIG. 32 is an exploded perspective view of the prior art showing the case securely attached after assembling the individual components to each lead frame element of the lead frame.
Figure 33:
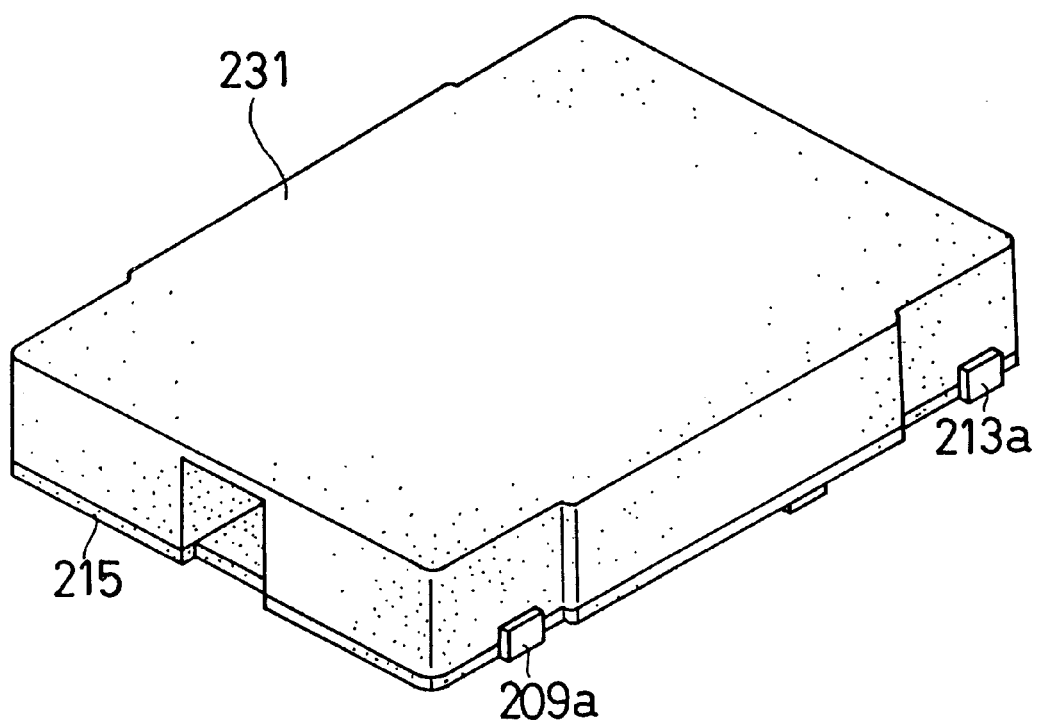
FIG. 33 is a perspective view of a completed electroacoustic transducer according to the prior art.

The aforementioned inserting method will now be discussed specifically. As shown in FIG. 24, a lead frame 125 previously patterned in a predetermined shape is prepared. The lead frame 125 has a plurality of lead frame elements 127 (surrounded by an alternate one long and two short dashes line in FIG. 24) coupled side by side, so that a plurality of electromagnetic type electroacoustic transducers (four electroacoustic transducers in this case) are manufactured at the same time. FIG. 20 shows the details of the lead frame element 127. The lead frame element 127 has a pair of frame guide rails 127a and 127b extending horizontally in FIG. 20, and protruding pieces 127c, 127d, 127e and 127f are provided between the pair of frame guide rails 127a and 127b. The distal end portions of the protruding pieces 127c and 127d become the aforementioned lead terminals 121 and 123.

As shown in FIG. 24, one constituting element of each electromagnetic type electroacoustic transducer, specifically the pole piece, is placed at the proper positions of the lead frame elements 127 of the lead frame 125 in a mold (not shown). Then, a resin is filled in the mold to form the aforementioned base member 103, at which time the lead frame elements 127 partially become integrated with the interior of the base member 103. Thereafter, the remaining components, namely the coil 109, the support ring 111, the magnet 113 and the elastic plate 117, are placed at the proper positions and the case 101 is securely attached to the base member 103. Then, the lead frame elements 127 are cut along cut lines A shown in FIG. 20 and the exposed portions are bent, providing the state shown in FIGS. 13 to 17. Besides the lead terminals 121 and 123, terminal members 129 and 131 which do not perform electric functions are likewise integrated with the base member 103, as shown in FIG. 20. That is, the distal end portions of the protruding pieces 127e and 127f shown in FIG. 20 become the terminal members 129 and 131.

The procedures for the insert formation are the same as those of the first embodiment.

Figure 13:
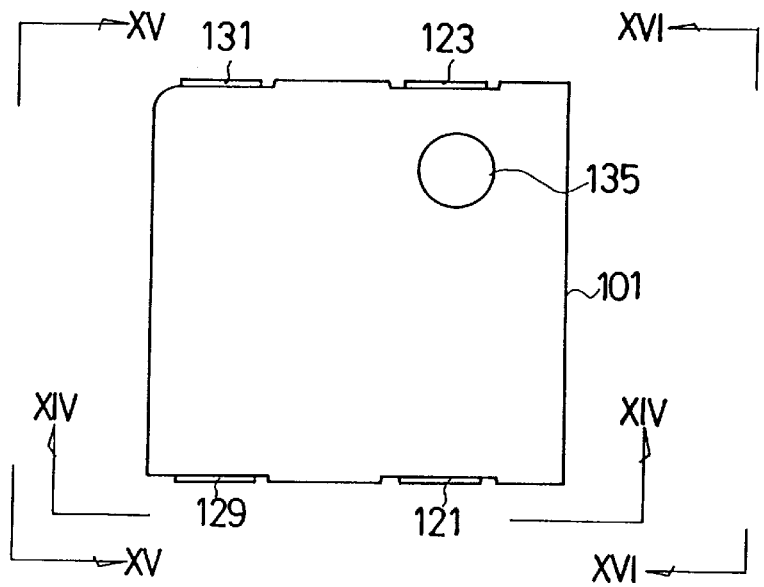
FIG. 13 is a plan view of an electroacoustic transducer according to the second embodiment of this invention.
Figure 16:
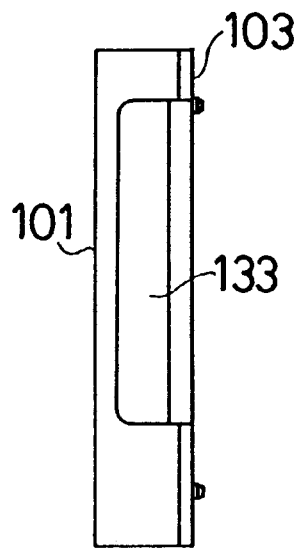
FIG. 16 is a diagram of the second embodiment as viewed from the line XVI—XVI in FIG. 13.
Figure 17:
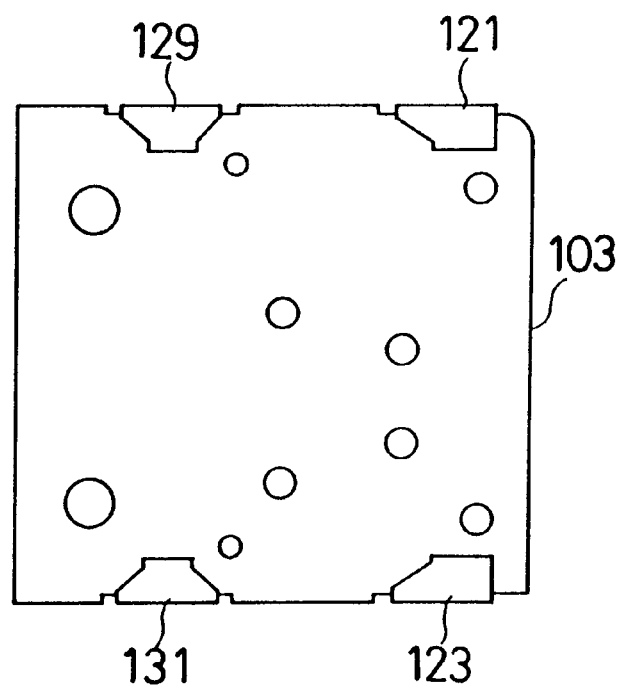
FIG. 17 is a bottom view of the electroacoustic transducer according to the second embodiment.

The appearance of the electromagnetic electroacoustic transducer is illustrated in FIGS. 13 through 17. As shown in FIG. 16, formed in one side of the case 101 is a sound port 133 through which sounds are output outside. As shown in FIG. 13, a polarity mark 135 indicative of a polarity is inscribed on the top of the case 101.

As the action of the thus constituted electromagnetic type electroacoustic transducer is the same as that of the first embodiment, its description will not be repeated.

Figure 14:
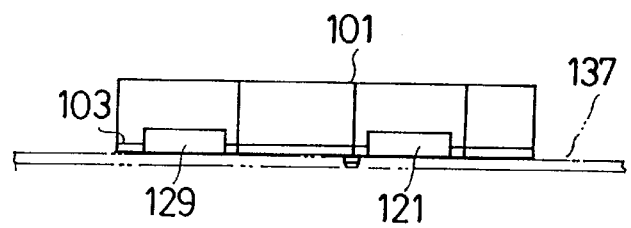
FIG. 14 is a diagram of the second embodiment as viewed from the line XIV—XIV in FIG. 13.
Figure 15:
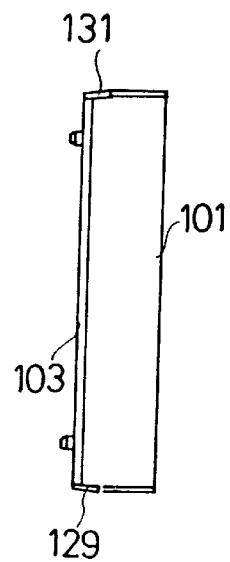
FIG. 15 is a diagram of the second embodiment as viewed from the line XV—XV in FIG. 13.

This electromagnetic type electroacoustic transducer is then to be incorporated into any desired device, such as a portable telephone or a pager. To accomplish this, as shown in FIG. 14, this electroacoustic transducer is attached to a mounting board 137 (indicated by an alternate one long and two short dashes line in FIG. 14) of the electronic device in the illustrated manner, and is soldered thereto via the lead terminals 121 and 123 and the lead terminals 129 and 131 which do not perform electric functions.

The lead frame 125 according to this embodiment will now be described more specifically. To begin with, the material for the lead frame 125 is the same as that of the first embodiment, so that it will not be discussed again.

The shape of the lead frame 125 will now be discussed. Let us now look at the portions of the projecting pieces 127c and 127d which serve as the lead terminals 121 and 123 in FIG. 20. Proximal ends 141 and 143 of the lands 121a and 123a are made narrower with circular holes 145 and 147 formed there. Narrowing the proximal ends 141 and 143 and forming the holes 145 and 147 there suppress the thermal conduction from the lands 121a and 123a and accelerate local heating on the lands 121a and 123a at the soldering time.

As apparent from the above, the second embodiment can have the same advantages as those of the first embodiment.

This invention is not limited to the first and second embodiments, but may be modified in various other ways within the scope of the appended claims.

Although the improvement on the material for the lead frame and the provision of the thermal conduction suppressing sections are combined in the first and second embodiments, only one of the features may be employed.

The number of holes to suppress thermal conduction is not limited to the one discussed above.

Although the foregoing description has been given of the case where a lead frame is used, this invention can still be adapted to an electroacoustic transducer which uses no lead frame and simply has lead terminals. The thermal conduction suppressing sections are not restricted to those illustrated, but may take various other structures as long as they reduce the portion which contributes to thermal conduction.

What is claimed is:

1. An electroacoustic transducer comprising:
   a case made of synthetic resin;
   a lead terminal; and
   a drive section including a coil;
   wherein said lead terminal includes (1) a land portion placed adjacent to said case and to which an end of said coil is coupled by soldering, and (2) a projecting portion extending from said land portion for electrically coupling to an external device, said projecting portion comprises at least one of a narrowed portion and an opening for suppressing thermal conduction between said projecting portion and said land portion.

2. An electroacoustic transducer comprising:
   a case made of synthetic resin;
   a lead terminal placed adjacent to said case; and
   a drive section disposed in said case and including a coil;
   wherein said lead terminal has (1) an electrical connection portion for said coil at a first ends (2) an electrical connection portion for an external device at a second end, and (3) a thermal conduction suppression portion between said first and said second ends for suppressing thermal conduction therebetween, and
   said thermal conduction suppression portion has a cross sectional area which is smaller than that of said first and said second ends.

3. An electroacoustic transducer comprising.
   a case made of synthetic resin;
   a lead terminal; and
   a drive section including a coil;
   wherein said lead terminal has (1) a land portion at a first end placed adjacent to said case and to which an end of said coil is coupled by soldering, (2) an electrical connection portion at a second end for an external device, and (3) a thermal conduction suppression portion between said first and said second ends for suppressing thermal conduction therebetween, and
   said thermal conduction suppression portion has a cross sectional area which is smaller than that of said first and said second ends.

* * * * *